(12) United States Patent
Vobecky et al.

(10) Patent No.: US 8,501,548 B2
(45) Date of Patent: Aug. 6, 2013

(54) METHOD FOR PRODUCING A SEMICONDUCTOR DEVICE USING LASER ANNEALING FOR SELECTIVELY ACTIVATING IMPLANTED DOPANTS

(75) Inventors: Jan Vobecky, Lenzburg (CH); Munaf Rahimo, Uezwil (CH)

(73) Assignee: ABB Technology AG, Zurich (CH)

( * ) Notice: Subject to any disclaimer, the term of this patent is extended or adjusted under 35 U.S.C. 154(b) by 326 days.

(21) Appl. No.: 12/951,334

(22) Filed: Nov. 22, 2010

(65) Prior Publication Data
US 2011/0136300 A1 Jun. 9, 2011

(30) Foreign Application Priority Data
Dec. 9, 2009 (EP) .................................... 09178466

(51) Int. Cl.
*H01L 21/332* (2006.01)
(52) U.S. Cl.
USPC .................................. 438/135; 257/E21.382
(58) Field of Classification Search
USPC .................................. 438/135; 257/E21.382
See application file for complete search history.

(56) References Cited

U.S. PATENT DOCUMENTS
2007/0232039 A1 10/2007 Kubo et al.
2008/0227277 A1 9/2008 Nakazawa
2009/0267200 A1* 10/2009 Gutt et al. ..................... 257/655

FOREIGN PATENT DOCUMENTS
WO WO 2009077583 A1 * 6/2009

OTHER PUBLICATIONS
European Search Report dated May 4, 2010, for Application No. 09178466.0.

* cited by examiner

*Primary Examiner* — Shaun Campbell
(74) *Attorney, Agent, or Firm* — Buchanan Ingersoll & Rooney PC

(57) ABSTRACT

A method for producing a semiconductor device such as a RC-IGBT or a BIGT having a patterned surface wherein partial regions doped with dopants of a first conductivity type and regions doped with dopants of a second conductivity type are on a same side of a semiconductor substrate is proposed. An exemplary method includes: (a) implanting dopants of the first conductivity type and implanting dopants of the second conductivity type into the surface to be patterned; (b) locally activating dopants of the first conductivity type by locally heating the partial region of the surface to be patterned to a first temperature (e.g., between 900 and 1000° C.) using a laser beam similar to those used in laser annealing; and (c) activating the dopants of the second conductivity type by heating the substrate to a second temperature lower than the first temperature (e.g., to a temperature below 600° C.). Boron is an exemplary dopant of the first conductivity type, and phosphorous is an exemplary dopant of the second conductivity type. Boron can be activated in the regions irradiated only with the laser beam, whereas phosphorus may be activated in a low temperature sintering step on the entire surface.

26 Claims, 5 Drawing Sheets

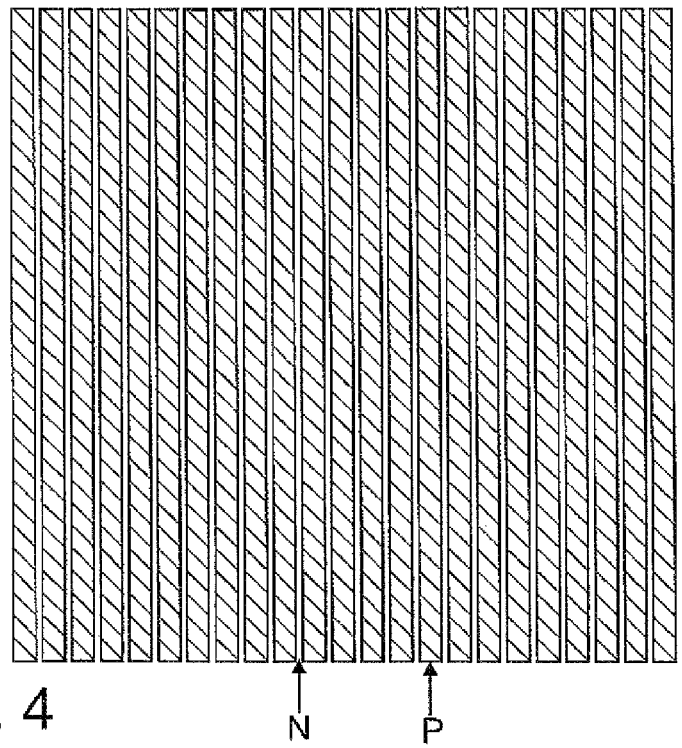
Fig. 4     N   P
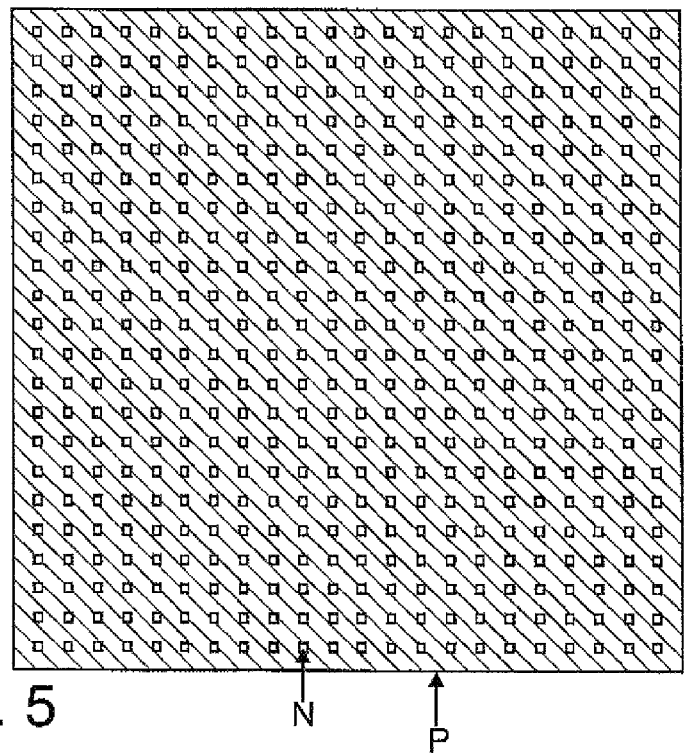
Fig. 5     N   P

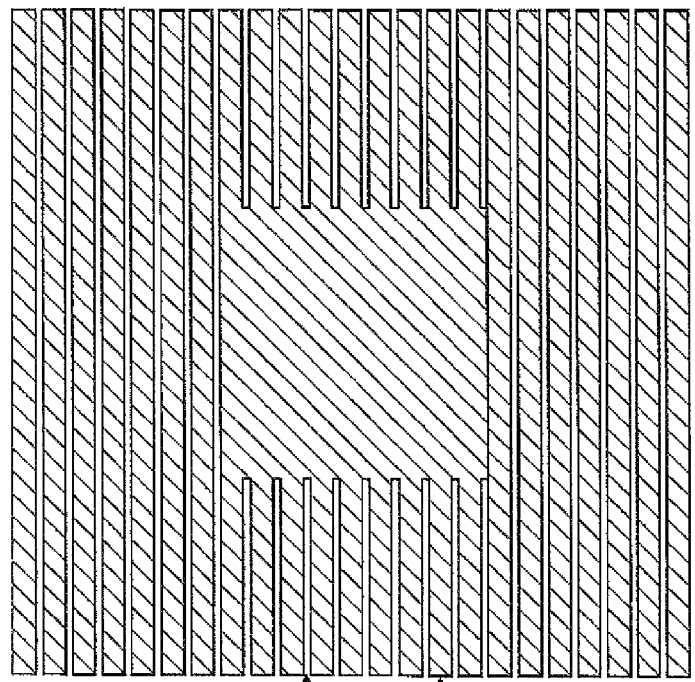
Fig. 6    N    P
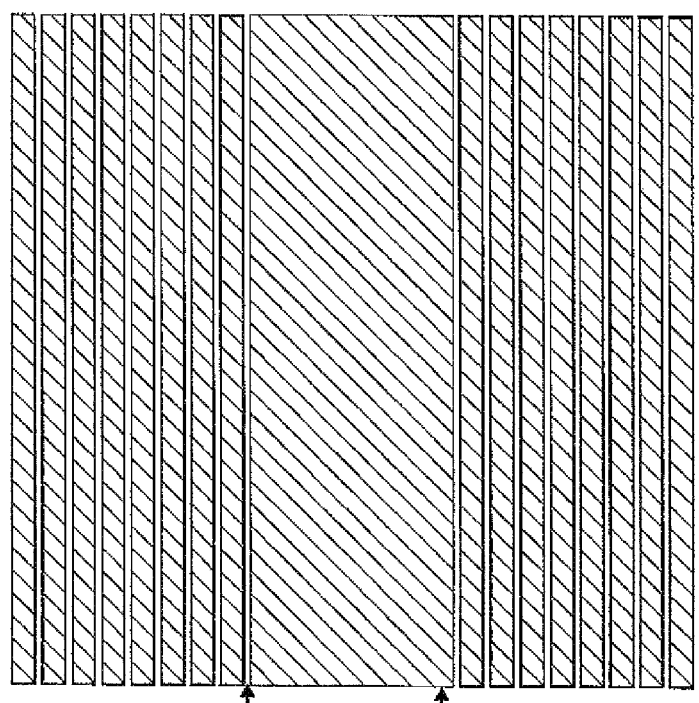
Fig. 7    N    P

N    P

N    P

METHOD FOR PRODUCING A SEMICONDUCTOR DEVICE USING LASER ANNEALING FOR SELECTIVELY ACTIVATING IMPLANTED DOPANTS

RELATED APPLICATION

This application claims priority under 35 U.S.C. §119 to European Patent Application No. 09178466.0 filed in Europe on Dec. 9, 2009, the entire content of which is hereby incorporated by reference in its entirety.

FIELD

The present disclosure is directed to methods for producing semiconductor devices using, for example, laser annealing for selectively activating implanted dopants.

BACKGROUND INFORMATION

There are semiconductor devices in which both n-type regions and p-type regions are to be generated on a same side of a semiconductor substrate. For example, manufacturing a next generation of IGBTs (Insulated Gate Bipolar Transistors) can involve properly patterned rear side surfaces of a semiconductor wafer wherein the rear side surface includes p-type regions forming an anode of the IGBT and the rear side also includes n-type regions forming a cathode of an antiparallel diode. Therein, "patterning" may refer to both an optimized geometry and an optimized doping profile of the p-type and n-type regions.

Such patterned semiconductors have been processed using for example sophisticated masking techniques. For example, an entire area of the surface to be patterned is first doped with a dopant, for example boron or aluminium for forming a p-type doping. Subsequently, areas which shall maintain the p-type doping can be protected with a protection layer such as a dielectric, which protection layer may be patterned using for example masking and photolithography technology. Then, in a second doping process, another dopant, for example phosphorus or arsenic for forming n-type doping, may be doped into the unprotected areas and overcompensate the dopant for forming a p-type doping in these areas.

In US 2009/267200 another manufacturing method for an IGBT using masks is described, in which a p-dopant like boron, boron fluoride or aluminum is deeply implanted through a mask into a first depth into a rear surface of the device and afterwards a first laser anneal is performed, by which anneal the surface is melted down to the first depth and the dopant is completely activated. Due to high mobility during the melting, the dopant is homogeneously distributed within the melted portion. Afterwards, an n-dopant such as phosphorous or arsenic is implanted into a second depth, which is smaller than the first depth in order to form an n-buffer. A second laser anneal is performed, by which the substrate melts to the second depth so that again the n dopant is homogeneously distributed in the melted portion.

However, such patterning of p-type and n-type regions using masking techniques may involve substantial labor and cost.

SUMMARY

A method for producing a semiconductor device is disclosed with a patterned surface having at least one partial region doped with a dopant of a first conductivity type and at least one region doped with a dopant of a second conductivity type on a same side of a semiconductor substrate, the method comprising: implanting the dopant of the first conductivity type and implanting the dopant of the second conductivity type into the surface to be patterned; locally activating the dopant of the first conductivity type by locally heating the at least one partial region of the surface to be patterned to a first temperature using a laser beam; and activating the dopant of the second conductivity type by heating the semiconductor substrate to a second temperature lower than the first temperature, wherein the dopant of the first conductivity type is implanted and activated in the partial region to a higher doping concentration than the dopant of the second conductivity type thereby locally overcompensating the dopant of the second conductivity type.

BRIEF DESCRIPTION OF THE DRAWINGS

Embodiments of the disclosure will be explained in more detail in the following text with reference to the attached drawings in which:

FIGS. 4 to 9 show top views onto patterned surfaces on rear sides of various semiconductor devices.

Figure 1:
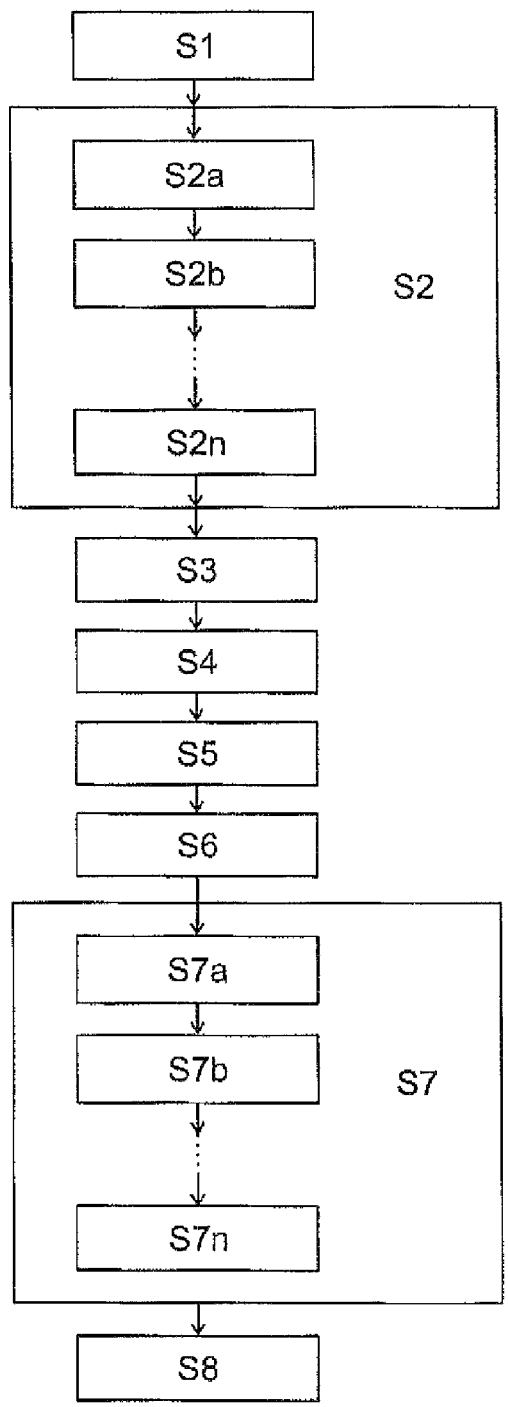
FIG. 1 shows a flow-chart describing an exemplary method for producing a semiconductor device according to an embodiment of the present disclosure.

The reference symbols used in the figures and their meaning are summarized in the list of reference symbols attached hereto. The drawings are only schematic illustrations and not to scale. Generally, like or like-functioning parts are given the same reference symbols. The described embodiments are meant as examples and shall not limit the disclosure.

DETAILED DESCRIPTION

The present disclosure relates to methods for producing semiconductor devices with patterned surfaces having, for example, at least one region doped with a dopant of a first conductivity type and at least one region doped with a dopant of a second conductivity type on a same side of a semiconductor substrate. Exemplary methods for producing semiconductor devices as disclosed herein can be implemented with reduced labor and cost.

According to an aspect of the present disclosure, exemplary methods for producing a semiconductor device with a patterned surface comprising at least one region doped with a dopant of a first conductivity type and at least one region doped with a dopant of a second conductivity type on a same side of a semiconductor substrate are proposed, wherein an exemplary method comprises the following features which may, or may not, be performed in the following order:

(a) implanting the dopant of the first conductivity type such as, for example boron or aluminium for forming p-type doping; and implanting the dopant of the second conductivity type such as, for example, phosphorus or arsenic for forming n-type doping into a surface to be patterned;

(b) locally activating the dopant of the first conductivity type by locally heating partial regions of the surface to be patterned to a first temperature using a laser beam; and (c) activating the dopant of the second conductivity type by heating the substrate to a second temperature lower than the first temperature.

Exemplary embodiments and methods of the disclosure use the following effect: It is known that a semiconducting material may be doped to have a specific conductivity type (e.g., to have n-type or p-type) by introducing particles such as atoms, ions or molecules into a crystal lattice of the semiconducting material. However, it has been observed that particles which have been introduced into the semiconducting material by ion implantation may need to be "activated" before effectively acting as a dopant. This effect may be understood to be due to the fact that during ion implantation, implanted particles may not be located at sites within a lattice of the semiconducting material at which sites they would effectively act as a dopant. Furthermore, the lattice of the semiconducting material may be damaged due to the ion implantation process. Accordingly, in order to activate the implanted particles it may be desirable to heat the implantation region and thereby sinter or even melt this region. Upon such heating, the implanted particles may diffuse within the lattice and may reach sites where they may effectively act as dopants.

It has been observed that different dopants may have to be, or may desirably be, activated by different heating procedures. For example, a first type of dopant such as for example boron may need to be heated to highly elevated temperatures such as for example more than 850° C. (preferably, for example, between 900 and 1000° C.), in order to be activated in a desired concentration to dopants. Other types of a dopant such as, for example, phosphorus may be activated in a desired concentration of dopant already at much lower temperatures, for example temperatures below 650° C. (preferably, for example, temperatures between 400 and 600° C., particularly for example, between 500 and 550° C.).

Accordingly, both types of dopants (e.g., a first type of dopant for generating a first conductivity type and a second type of dopant for generating a second conductivity type) may be implanted into the surface of the semiconductor substrate to be patterned. Areas into which the dopant of the first conductivity type is implanted and areas into which the dopant of the second conductivity type is implanted may at least partially overlap such that in the overlapping areas, both dopants exist after the implantation processes. It may also be desirable to implant the dopant of each type of conductivity into the entire substrate surface to be patterned.

Then, for generating the type of conductivity which shall finally prevail at a specific location within the patterned substrate surface, the respective dopant may be selectively activated by using a suitable heating process.

If, for example, a location is heated only to a low temperature of (e.g., 600° C.) only the type of dopant generating the second conductivity type which dopants may be activated at such low temperatures, will actually be activated whereas the other type of dopant generating the first conductivity type, which dopant needs a higher activation temperature, remains inactivated or activated to a much lower concentration than the second conductivity type. Accordingly, such a region of the patterned substrate surface will result with the second conductivity type.

At another location of the substrate surface to be patterned, a different heating process may be used in order to heat to a much higher temperature (e.g., more than 850° C. or even 900° C., or more), at which temperature also the dopant of the first conductivity type is activated.

It may then be desirable to implant and activate the dopant of the first conductivity type to a higher doping concentration than the dopant of the second conductivity type such that the dopant of the first conductivity type may locally overcompensate the dopant of the second conductivity type. Accordingly, when a region of the substrate surface is locally heated to a very elevated temperature of for example between 900 and 1000° C., while both types of dopants are activated, the region will result with the first conductivity type, as the dopant of the first conductivity type will be present in a higher concentration than the dopant of the second conductivity type such that the dopant of the first conductivity type determines the final conductivity type at this location. When a region of the substrate surface is heated only to a low temperature (e.g., less than 650° C.), the dopant of the second conductivity type is activated while the dopant of the first conductivity type is not activated, or is not completely activated, such that the dopant of the first conductivity type determines the final conductivity type.

In order to achieve suitable doping concentrations and doping profiles, the energies and doses with which each of the dopants of the first and second conductivity type are implanted may have to be optimized for the forthcoming process of the doping activation. For example, it has been found that the dopant of the first conductivity type may be suitably implanted with a dose ranging from $1 \times 10^{13}$ cm$^{-2}$ to $1 \times 10^{16}$ cm$^{-2}$ and with an energy ranging from 5 keV –200 keV while the dopant of the second conductivity type may be suitably implanted with a dose ranging from $1 \times 10^{12}$ cm$^{-2}$ to $1 \times 10^{16}$ cm$^{-2}$ and with an energy ranging from 50 keV to 600 keV.

Furthermore, it may be desirable to implant the dopant of the first conductivity type to a lower depth than the dopant of the second conductivity type. Such different implantation depth can, for example, be used to easily generate the very high temperatures specified to activate the dopant of the first conductivity type only in a shallow layer close to the surface of the semiconductor substrate whereas the lower temperatures needed to activate the dopant of the second conductivity type may be easily reached also for greater depths.

In order to locally activate the dopant of the first conductivity type, respective regions may be locally heated by using a laser beam of suitable energy and wavelength. For example, such a laser beam may be provided by an apparatus which has been developed for the well-known process of laser annealing. Therein, a laser beam of high energy and small focal spot may be directed on a region to be heated to highly elevated temperatures. The laser beam may be scanned along a region which in the final semiconductor device shall have the first conductivity type. A laser energy density and a scanning speed may be adapted such that a superficial portion of the substrate is temporarily heated to the highly elevated first temperature. Therein, the superficial portion may have a depth of less than for example, 1 µm, and less than for example, 300 nm. Accordingly, as the time during which the region is illuminated with the laser beam may be very short, the laser beam's energy may not dissipate into a greater depth of the substrate such that only the superficial portion is heated to the high first temperature and such that only in this superficial portion, the dopant forming the first conductivity type is actually activated.

The proposed method may be used within a processing sequence for producing various kinds of semiconductor devices having both, n-type and p-type regions on a same side of a semiconductor substrate. For example, the proposed method may be used in a processing sequence for preparing a reverse conducting insulated gate bipolar transistor (RC-IGBT) or a bimode insulated gate bipolar transistor (BIGT). In such semiconductor devices, the side having the patterned surface is the rear side of the semiconductor device.

When preparing semiconductor devices such as an RC-IGBT or a BIGT, front side structures of the semiconductor device may be prepared first before the process steps of implanting and activating of the method as described herein are performed. In other words, the front side structures of the semiconductor device comprising, for example, various doped areas, passivation layers and/or metallization layers may be completely prepared before subsequent steps, wherein the rear side structures containing inter alia the patterned surface with its regions doped with dopants of the first and second conductivity type are generated. Therein, benefit may be taken from the fact that for activating the dopants of the first and second conductive type, not the entire semiconductor device has to be heated to very elevated temperatures. To the contrary, the patterned surface on the rear side of the semiconductor device may be prepared by heating the entire device only up to the low second temperature of for example between 500 and 650° C. Such low temperature may activate the dopant of the second conductivity type without harming or damaging the structures previously prepared on the front side of the semiconductor substrate, such structures frequently including aluminium layers having a melting point well above such temperatures. The dopant of the first conductivity type may be locally activated by laser annealing locally heating the respective partial regions of the rear side surface (e.g. up to temperatures above, e.g., 900° C.). Therein, benefit may be taken from the fact that in the laser annealing step the highly elevated first temperature is only attained in a very shallow region close to the surface irradiated by the laser beam but, for example due to the short pulse duration used for the local laser annealing, the heat energy does not dissipate throughout the entire semiconductor substrate. Thus, the front side including the structures previously prepared thereon is not heated to very elevated temperatures and is thus therefore not negatively affected by the step of locally activating the dopant of the first conductivity type at the highly elevated first temperature.

According to a specific processing sequence, the step of heating the substrate to the second, low temperature 4 can be performed as a sintering step subsequent to the step of locally heating partial regions of the substrate to be patterned to the first, high temperature using a laser beam. In other words, first, the dopant of the first conductivity type is activated by locally heating the respective partial regions using the laser beam and then, in a subsequent heating step, the dopants of the second conductivity type are activated. Therein, the second heating step may be a heating step which, in a known semiconductor processing sequence, is performed to, for example, sinter metallization layers applied to the semiconductor substrate in order to form electrical contacts. Accordingly, for generating the patterned surface after implanting dopants of both conductivity types, only one additional processing step (e.g., a step of locally activating the dopant of the first conductivity type using the laser beam), may be involved, while the step of activating the dopant of the second conductivity may be combined with a sintering step performed, for example, near the end of a processing sequence.

Exemplary aspects and embodiments of the present disclosure are described herein with reference to different subject-matters. For example, some features are described with reference to the method for producing the semiconductor device whereas other features are described with reference to the semiconductor device itself. However, those skilled in the art will gather from the above and the following description that, unless other notified, in addition to any combination or features belonging to one type of subject-matter, any combination between features relating to different subject-matters, for example, between features of semiconductor devices and features of methods for producing such devices, is considered to be disclosed herein.

With respect to the flow-chart shown in FIG. 1, a processing sequence for producing a semiconductor device such as an RC-IGBT will be described. The processing sequence includes process steps for generating a patterned surface having at least one n-type region and at least one p-type region on a same side of a semiconductor substrate in accordance with an exemplary embodiment of the present disclosure.

First, a semiconductor substrate such as a silicon wafer is provided (step S1). On this semiconductor substrate, a plurality of processing steps (step 2 which includes a plurality of sub-steps S2a, S2b, ..., S2n) are performed in order to generate front size structures of the semiconductor device to be prepared such as various doped regions, dielectric layers and metallization layers.

After the device front side processing is completed as for known state-of-the-art devices, the semiconductor substrate may be optionally thinned to a final thickness, for example by grinding and/or etching (step S3).

Then, for forming the rear side structures of the semiconductor device, phosphorus ions providing in this case the dopant of the second type conductivity (i.e., n-type conductivity) are, for example, ion-implanted into an entire rear side surface of the silicon substrate (step S4) with exemplary implantation doses ranging from $1\times10^{12}$ cm$^{-2}$ up to $1\times10^{16}$ cm$^{-3}$. Exemplary implantation energies range from 50 keV up to 600 keV.

Afterwards, boron ions forming in this case the dopant of the first conductivity type (i.e. of the p-type conductivity) are, for example, implanted into the entire rear side of the silicon substrate (step S5). Exemplary implantation doses range from $1\times10^{13}$ cm$^{-3}$ up to $1\times10^{16}$ cm$^{-3}$. Exemplary implantation energies range from 5 keV up to 200 keV. The energies and doses of both species may be optimized for the forthcoming process of the doping activation.

Then, laser annealing is applied (step S6) in a way that only regions forming future anodes of the IGBT (e.g., p-type regions at the rear side surface of the substrate) are exposed to a focused laser beam. The laser beam may be provided by a scanned green-light (~520 nm) YAG-type laser having an exemplary laser power density between 1 and 4 J/cm$^2$ with a pulse duration of 200-600 ns and a spot size width of for example about 40 μm. Alternatively, an exciplex pulsed ultra violet (~308 nm) laser having an exemplary laser power density between 1-7 J/cm$^2$ with a pulse duration of 100-200 ns and a spot size up to 1 cm$^2$ may be used. Due to such laser irradiation, a shallow region having an exemplary thickness of 20-1000 nm for the green laser and 10-20 nm for the exciplex laser underneath the irradiated surface is temporarily heated to very elevated temperatures of 900-1000° C. and may thereby even be melted. Thereby, the boron ions previously implanted but not yet activated may be locally activated in the irradiated regions. Accordingly, the regions forming the future anodes (p-type regions) may be formed by the highly activated boron by means providing the selectively applied laser beam, while those regions of the future cathodes of the IGBT are left unexposed to the laser beam.

Then, further processing steps (step S7, which may include a plurality of sub-steps S7a, S7b, ..., S7n) may be performed for example for forming a stack of several metal layers forming a rear side contact of the final semiconductor device.

The metal contacts thus deposited after the laser annealing may subsequently be sintered at temperatures below, for example, 550° C. As the phosphorus previously implanted into the rear side surface may be significantly activated already at 400-500° C., such sintering step (step S8) may at the same time serve for activating the phosphorus dopant in order to thereby generate cathode regions of the semiconductor device. However, as boron activation is low at low temperatures between 400 and 500° C. and even falls with increasing temperature up to 700° to increase again above 900° C., the low temperature sintering step may not fully activate the implanted boron. The full activation of boron may only be achieved by heating up to a specified temperature (e.g., 900-1000° C., or higher in the case of melting by the laser beam) as is the case in the laser annealing activation step (step S6) described herein.

Accordingly, a semiconductor device with a patterned rear side surface may be obtained. Due to the higher concentration of boron ions compared to the concentration of phosphorus ions after the implantation steps (steps S4, S5), at positions of increased boron activation, the created boron acceptors may compensate the phosphorous donors. To achieve this effect, the implantation doses and energies of both the boron and the phosphorous implantation, involve a proper design and, therefore, can be optimized.

Figure 2:
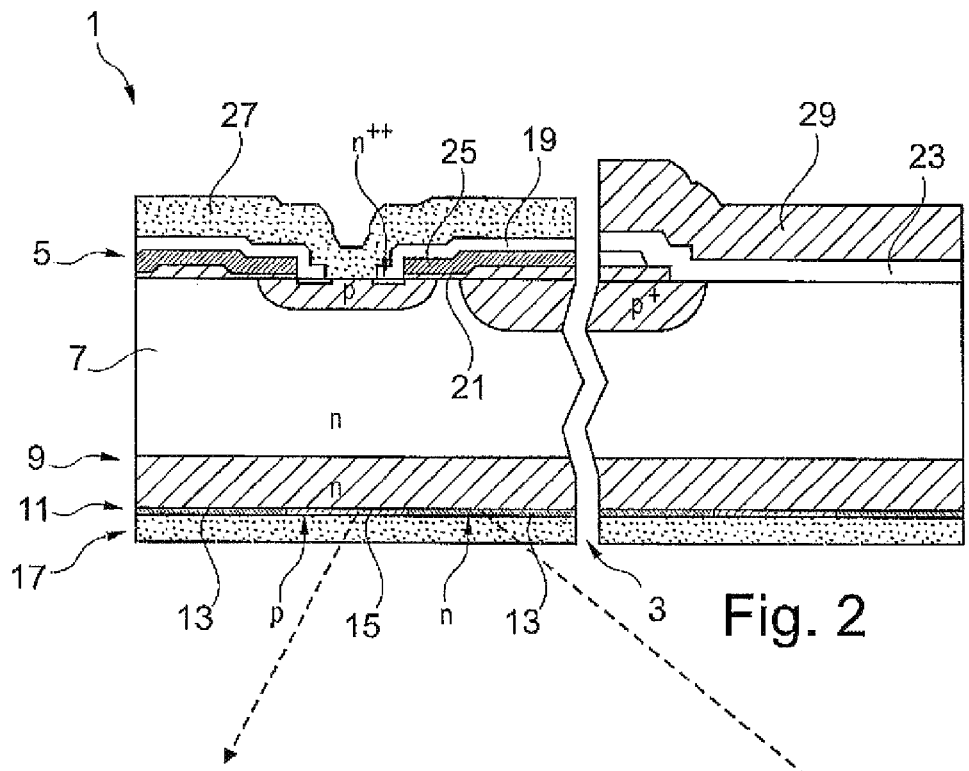
FIG. 2 shows an exemplary semiconductor device having a patterned rear surface comprising n-type regions and p-type regions.
Figure 3A:
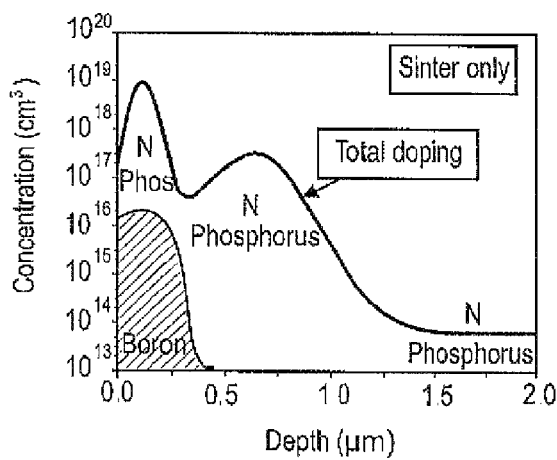
FIG. 3a shows an exemplary diffusion profile at a rear side of the FIG. 2 semiconductor device having an n-type doping at a region close to the rear surface generated with an exemplary method according to an embodiment of the present disclosure.
Figure 3B:
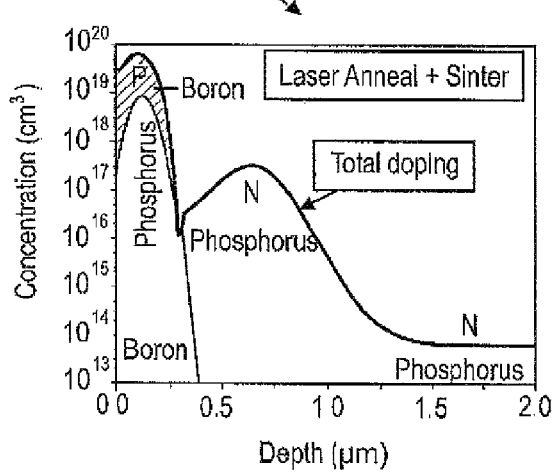
FIG. 3b shows an exemplary diffusion profile at a rear side of the FIG. 2 semiconductor device having an p-type doping at a region close to the rear surface generated with an exemplary method according to an embodiment of the present disclosure.

Referring to FIGS. 2, 3a and 3b, a semiconductor device 1 in the form of an IGBT having a patterned surface 3 on its rear side can be generated by a method according to an embodiment of the present disclosure described herein.

On a front side 5 of a semiconductor substrate 7 provided by a silicon wafer, a plurality of differently doped regions n, $n^{++}$, p, $p^+$, $p^-$ are formed by diffusion and/or implantation techniques. Furthermore, a plurality of dielectric layers 19, 21, 23 such as a PSG layer (phosphor-silicate-glass), a gate oxide layer and/or a SiN layer (silicon nitride), semiconductor layers 25 such as a poly layer (polycrystalline silicon) and/or a SIPOS layer (semi-insulating polycrystalline silicon), and/or metal layers 27 such as an Al layer (aluminium) and/or a Ni layer (nickel) and possibly additional layers such as a passivation layer 29 made from polyimide are formed. All these layers and their respective production steps may be formed in known fashion. Accordingly, the front size structure of the IGBT may be a known structure, and may be processed before processing the rear side of the IGBT.

On the rear side 9 of the semiconductor substrate 7, several doping layers n, $n^+$ and $p^+$ may be generated. For example, close to a rear side surface of the semiconductor substrate 7, a superficial shallow layer 11 may be provided into which layer 11 both, boron ions and phosphorus ions have been implanted. From this layer 11, both, an $n^+$-type region 13 or a $p^+$-type region 15 may be generated, depending on the process steps performed after ion implantation. On this patterned rear side surface 3, a stack 17 having several metallization layers made from Al (Aluminium), Ti (Titanium), Ni (Nickel) and/or Ag (Silver) can be applied in order to form electrical contacts.

The substrate has a thickness of between for example, 50 and 250 µm. The method proposed herein may be specifically suitable for such thin substrates as they provide for a low voltage drop at an ON state.

As explained with respect to the diagram shown in FIG. 3a, an $n^+$-type region 13 may be provided by activating only the phosphorus atoms. These regions 13 are submitted to a sinter step at approximately, for example, 500° C. only and the boron atoms implanted in these partial regions 13 do not experience high temperatures (e.g., temperatures of more than 900° C.). Therefore, a major part of the boron atoms implanted into a shallow superficial region with an exemplary depth of approximately 400 nm are not activated. In an exemplary embodiment, while only a minor portion of the boron atoms with a concentration of less than $3\times10^{16}$ cm$^{-3}$ is activated in this region, the major part of the implanted phosphorus atoms having a doping concentration of more than $2\times10^{17}$ cm$^{-3}$ is activated. Thus, the resulting conductivity type in this region 13 is the n-type conductivity.

An adjacent partial region 15 has been irradiated with a laser beam during a laser annealing step and has thereby temporarily been heated to exemplary temperatures above 900° C. As described with respect to the diagram shown in FIG. 3b, the boron atoms implanted into the superficial shallow region are therefore almost completely activated. Accordingly, the active boron doping concentration reaches exemplary values up to more than $2\times10^{19}$ cm$^{-3}$ and is therefore able to overcompensate the phosphorus doping having exemplary concentrations of less than $1\times10^{19}$ cm$^{-3}$ in this superficial region. Accordingly, the partial areas 15 having been submitted to both, a high temperature laser annealing step and a low temperature sintering step, will form $p^+$-type regions at the rear side surface of the semiconductor substrate 7.

Figure 8:
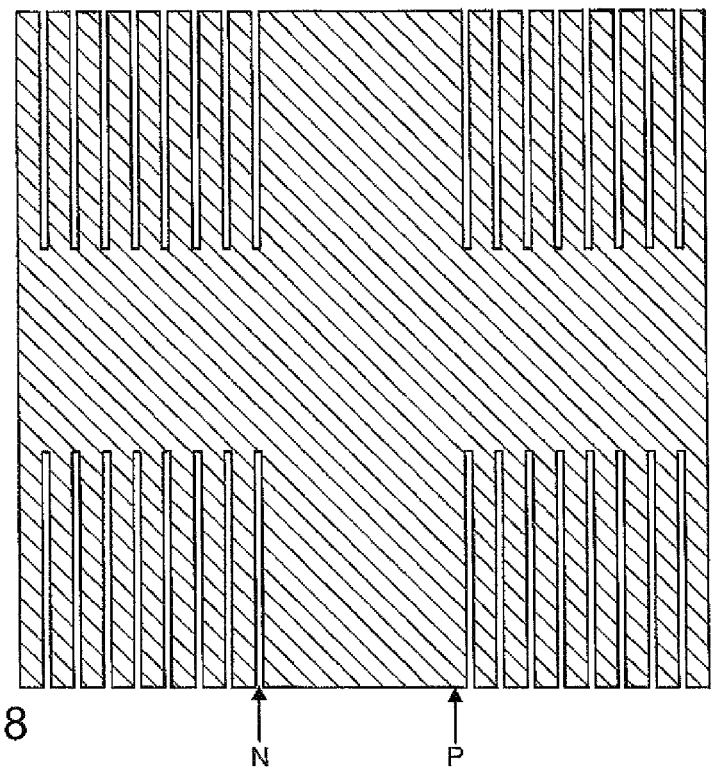
Figure 9:
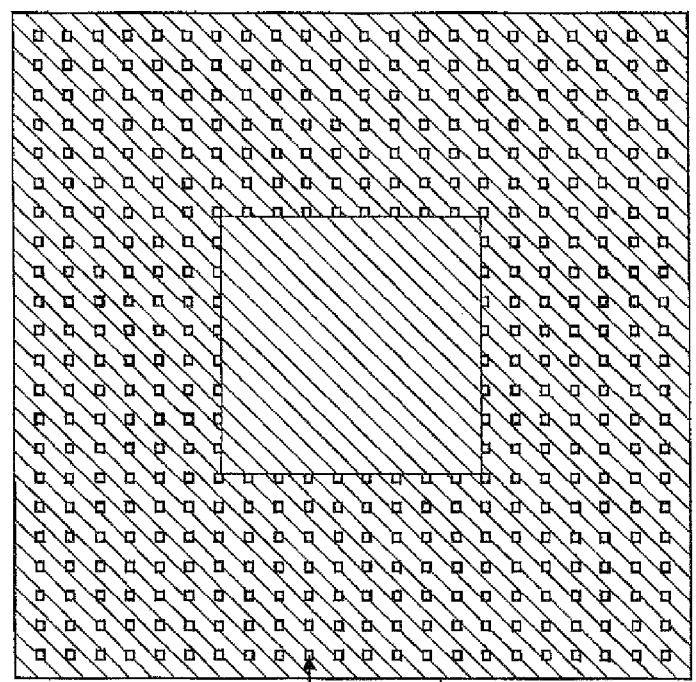

FIGS. 4 to 9 show top views onto patterned surfaces 3 on rear sides of various semiconductor devices. FIG. 4 shows a RC-IGBT Stripe design. FIG. 5 shows a RC-IGBT Cell design. FIGS. 6 to 8 show BIGT Hybrid designs. FIG. 9 shows a BIGT Cell design. The p-type regions (indicated as shaded regions) are the regions in which the p-type dopants have been activated with the laser beam.

Exemplary methods described herein may be combined with other method steps like hydrogen implantation, and the geometry of the p-type regions activated by the laser beam may be selected by a control software of the laser beam source and may therefore be very flexible with minimal cost. The proposed method is intended to cover any and all adaptations for variations of various embodiments, for example the processing of "anode shorts" of IGBTs to reduce switching losses, reduce oscillations or diodes and so forth.

By the methods as described herein, a semiconductor device can be created with a p-doped partial region 15 and an n-doped region 13. However, it is also possible to exchange the doping types of these regions, (e.g., to have an n-doping as the first conductivity type and to have p-doping as the second conductivity type). In that case, for example, an n-doped partial region 15 is activated by locally heating partial regions of the surface to a first temperature using a laser beam and a p-doped region 13 by heating the substrate to a certain temperature being lower than the first temperature.

For the creation of the region 15 and/or the partial region 13, one dopant can be applied for each region. It is, however, also possible to apply a plurality of such dopants. As an example, this can be done by applying boron and aluminum dopants as dopants of the first conductivity type and/or phosphorous and arsenic as dopants of the second conductivity type.

It should be noted that the term "comprising" does not exclude other elements or steps and that the indefinite article "a" or "an" does not exclude the plural. Also elements described in association with different embodiments may be combined. It should also be noted that reference signs in the claims shall not be construed as limiting the scope of the claims.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SIGNS

1 Semiconductor device
3 Patterned surface
5 Front surface
7 Semiconductor substrate
9 Rear surface
11 Superficial layer
13 region of second conductivity type
15 region of first conductivity type
17 Metal contact stack
19 dielectric layer
21 dielectric layer
23 dielectric layer
25 semiconductor layer
27 metal layer
29 passivation layer

What is claimed is:

1. A method for producing a semiconductor device with a patterned surface having at least one partial region doped with a dopant of a first conductivity type and at least one region doped with a dopant of a second conductivity type on a same side of a semiconductor substrate, the method comprising:
   implanting the dopant of the first conductivity type and implanting the dopant of the second conductivity type into the surface to be patterned;
   locally activating the dopant of the first conductivity type by locally heating the at least one partial region of the surface to be patterned to a first temperature using a laser beam; and
   activating the dopant of the second conductivity type by heating the semiconductor substrate to a second temperature lower than the first temperature, wherein the dopant of the first conductivity type is implanted and activated in the partial region to a higher doping concentration than the dopant of the second conductivity type thereby locally overcompensating the dopant of the second conductivity type.

2. The method of claim 1, wherein the dopant of the first conductivity type is at least one of boron and aluminum for forming p-type doping.

3. The method of claim 1, wherein the dopant of the second conductivity type is at least one of phosphorous and arsenic for forming n-type doping.

4. The method of claim 1, wherein the first temperature is above 850° C.

5. The method of claim 1, wherein the second temperature is below 650° C.

6. The method of claim 1, wherein the dopant of the first conductivity type is implanted with at least one of a dose ranging from $1e13/cm^2$ to $1e16/cm^2$ and an energy ranging from 5 keV to 200 keV.

7. The method of claim 1, wherein the dopant of the second conductivity type is implanted with at least one of a dose ranging from $1e12/cm^2$ to $1e16/cm^2$ and an energy ranging from 50 keV to 600 keV.

8. The method of claim 1, wherein the dopant of the first conductivity type is implanted to a lower depth than the dopant of the second conductivity type.

9. The method of claim 1, wherein areas into which the dopant of the first conductivity type is implanted and areas into which the dopant of the second conductivity type is implanted at least partially overlap.

10. The method of claim 1, wherein locally activating the dopant of the first conductivity type comprises:
    scanning a laser beam of a laser annealing apparatus along the partial region to be locally activated.

11. The method of claim 10, wherein a laser energy and a scanning speed are adapted such that a superficial layer of the substrate is temporarily heated to the first temperature, the superficial portion having a depth of less than 1 μm.

12. The method of claim 1, wherein heating the substrate to the second temperature comprises:
    sintering subsequent to the locally heating of the partial region of the surface to be patterned to the first temperature using the laser beam.

13. The method of claim 12, comprising:
    generating front side structures, wherein the implanting and activating are performed after the generating of front side structures.

14. The method of claim 1, wherein the semiconductor device is one of a reverse conducting insulated gate bipolar transistor (RC-IGBT) and a bimode insulated gate bipolar transistor (BIGT), and wherein the side having the patterned surface is a rear side of the semiconductor device.

15. The method of claim 1, wherein the semiconductor device is a diode.

16. The method of claim 2, wherein the dopant of the second conductivity type is at least one of phosphorous and arsenic for forming n-type doping.

17. The method of claim 2, wherein the first temperature is above 850° C.

18. The method of claim 3, wherein the second temperature is below 650° C.

19. The method of claim 16, wherein the dopant of the first conductivity type is implanted to a lower depth than the dopant of the second conductivity type.

20. The method of claim 16, wherein areas into which the dopant of the first conductivity type is implanted and areas into which the dopant of the second conductivity type is implanted at least partially overlap.

21. The method of claim 2, wherein the dopant of the first conductivity type is implanted with at least one of a dose ranging from $1e13/cm^2$ to $1e16/cm^2$ and an energy ranging from 5 keV to 200 keV.

22. The method of claim 17, wherein the dopant of the first conductivity type is implanted with at least one of a dose ranging from $1e13/cm^2$ to $1e16/cm^2$ and an energy ranging from 5 keV to 200 keV.

23. The method of claim 3, wherein the dopant of the second conductivity type is implanted with at least one of a dose ranging from $1e12/cm^2$ to $1e16/cm^2$ and an energy ranging from 50 keV to 600 keV.

24. The method of claim 18, wherein the dopant of the second conductivity type is implanted with at least one of a dose ranging from $1e12/cm^2$ to $1e16/cm^2$ and an energy ranging from 50 keV to 600 keV.

25. The method of claim 2, wherein locally activating the dopant of the first conductivity type comprises:
    scanning a laser beam of a laser annealing apparatus along the partial region to be locally activated.

26. The method of claim 3, wherein heating the substrate to the second temperature comprises:

sintering subsequent to the locally heating of the partial region of the surface to be patterned to the first temperature using the laser beam.

\* \* \* \* \*